United States Patent
Kobayashi (10) Patent No.: US 11,394,903 B2
(45) Date of Patent: Jul. 19, 2022

(54) IMAGING APPARATUS, IMAGING SYSTEM, AND MOVING BODY

(71) Applicant: CANON KABUSHIKI KAISHA, Tokyo (JP)

(72) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/138,700

(22) Filed: Sep. 21, 2018

(65) Prior Publication Data

US 2019/0104262 A1  Apr. 4, 2019

(30) Foreign Application Priority Data

Sep. 29, 2017 (JP) ............................ JP2017-192056

(51) Int. Cl.
| | |
|---|---|
| H04N 5/378 | (2011.01) |
| H04N 5/341 | (2011.01) |
| G06T 7/55 | (2017.01) |
| H04N 5/372 | (2011.01) |
| B60R 21/0134 | (2006.01) |
| H01L 27/146 | (2006.01) |
| B60W 30/09 | (2012.01) |

(52) U.S. Cl.
CPC ............... *H04N 5/341* (2013.01); *G06T 7/55* (2017.01); *H04N 5/378* (2013.01); *B60R 21/0134* (2013.01); *B60W 30/09* (2013.01); *B60W 2420/42* (2013.01); *G06T 2207/10028* (2013.01); *G06T 2207/30261* (2013.01); *H01L 27/14634* (2013.01); *H04N 5/37206* (2013.01)

(58) Field of Classification Search
CPC .... H04N 5/341; H04N 5/378; H04N 5/37206; H04N 5/37455; H04N 5/376; H04N 5/3765; G06T 7/55; G06T 2207/10028; G06T 2207/30261; B60R 21/0134; H01L 27/14634; B60W 30/09; B60W 2420/42
USPC ........................... 348/135, 140, 148, 208.14
See application file for complete search history.

(56) References Cited

U.S. PATENT DOCUMENTS

| | | | |
|---|---|---|---|
| 2011/0134265 A1 | 6/2011 | Morishita | |
| 2015/0381915 A1 | 12/2015 | Mabuchi | |
| 2016/0267317 A1* | 9/2016 | Iwase | G02B 21/26 |
| 2016/0275694 A1* | 9/2016 | Nomura | G06T 7/20 |
| 2017/0085824 A1 | 3/2017 | Mabuchi | |

FOREIGN PATENT DOCUMENTS

| | | |
|---|---|---|
| CN | 102137237 A | 7/2011 |
| CN | 102595057 A | 7/2012 |
| CN | 104937923 A | 9/2015 |
| CN | 104956663 A | 9/2015 |
| JP | 2014-155175 A | 8/2014 |
| JP | 2014-179893 A | 9/2014 |
| JP | 2015-154089 A | 8/2015 |
| JP | 2016-046772 A | 4/2016 |
| JP | 2016-076895 A | 5/2016 |

* cited by examiner

*Primary Examiner* — Michael E Teitelbaum
(74) *Attorney, Agent, or Firm* — Canon U.S.A., Inc. IP Division

(57) ABSTRACT

A first pixel group disposed in a first direction is read in the first direction. A second pixel group adjacent to the first pixel group is read in a second direction, which is opposite to the first direction.

16 Claims, 12 Drawing Sheets

FRONT VIEW

TOP VIEW

REAR VIEW

IMAGING APPARATUS, IMAGING SYSTEM, AND MOVING BODY

BACKGROUND OF THE INVENTION

Field of the Invention

The aspect of the embodiments relates to an imaging apparatus, an imaging system, and a moving body.

Description of the Related Art

A complementary metal-oxide-semiconductor (CMOS) sensor is known, which is obtained by providing pixels on a first chip, providing on a second chip an analog-digital conversion unit (an AD conversion unit) corresponding to one or more of the pixels, and bonding the first and second chips by Cu—Cu bonding. In Japanese Patent Application Laid-Open No. 2014-155175, the area of a portion covered by a single AD conversion unit corresponds to the area of a portion covered by a plurality of pixels. Thus, a plurality of pixels provided on a first chip and a single AD conversion unit provided on a second chip are connected together in association with each other.

Figure 10:
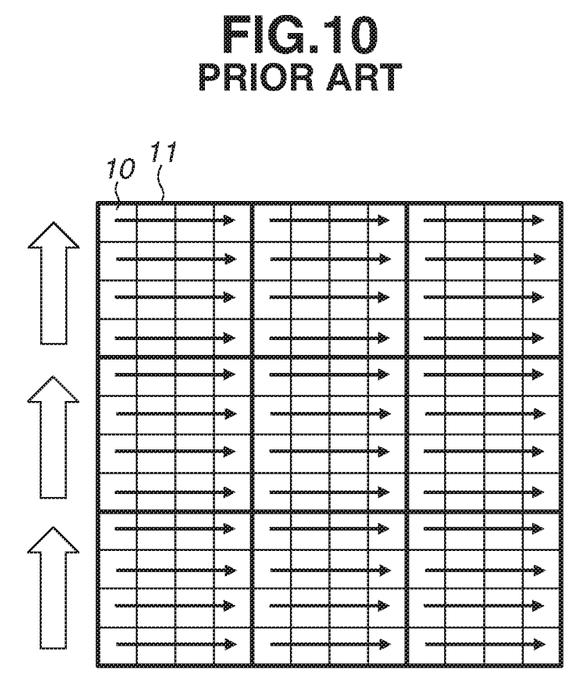
FIG. 10 is a schematic diagram illustrating an imaging apparatus according to Japanese Patent Application Laid-Open No. 2014-155175.

Japanese Patent Application Laid-Open No. 2014-155175 discusses a reading order in FIG. 10 (corresponding to FIG. 1 of Japanese Patent Application Laid-Open No. 2014-155175). FIG. 10 illustrates a conceptual diagram of a reading method discussed in Japanese Patent Application Laid-Open No. 2014-155175. A thin-lined rectangle 10 represents a pixel. A thick-lined rectangle 11 represents a pixel block. A single pixel block 11 includes 4×4, i.e., a total of 16, pixels 10. FIG. 10 illustrates an example where nine pixel blocks 11 are disposed. In each pixel block 11, with the pixel in the fourth row and the first column as a starting point, reading is started in the row direction. That is, reading is performed in the direction from the fourth row and the first column to the fourth row and the fourth column. Next, reading is sequentially performed from the third row and the first column to the third row and the fourth column, and from the second row and the first column to the second row and the fourth column. Then, the pixel in the first row and the fourth column is read last.

Figure 11A:
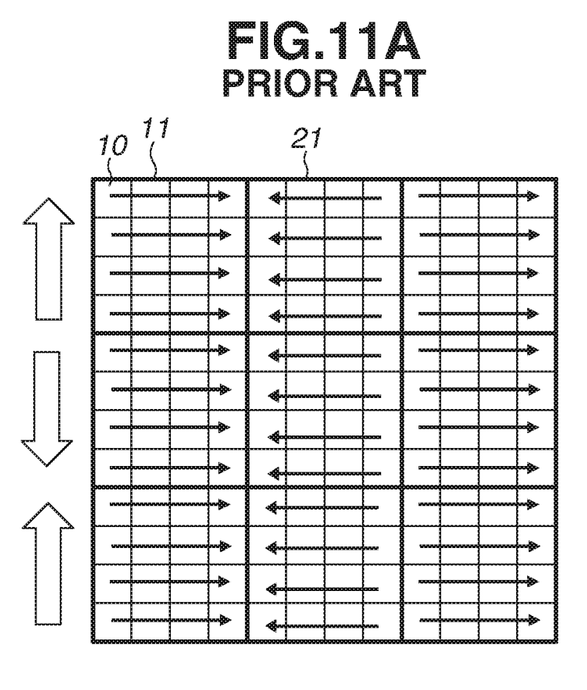
FIGS. 11A and 11B are schematic diagrams illustrating the imaging apparatus according to Japanese Patent Application Laid-Open No. 2014-155175.

Further, Japanese Patent Application Laid-Open No. 2014-155175 also discusses a reading order in FIG. 11A (corresponding to FIG. 5 of Japanese Patent Application Laid-Open No. 2014-155175). In FIG. 11A, the reading order of a pixel block 11 is different from the reading order of a pixel block 21. In the pixel block 11, a reading method similar to the reading method for the pixel block 11 in FIG. 10 is executed. On the other hand, in the pixel block 21, with the pixel in the fourth row and the fourth column as a starting point, reading is performed from the fourth row and the fourth column to the fourth row and the first column. Rows to be read are sequentially shifted in the direction of a smaller row number. Then, the pixel in the first row and the first column is read last.

In the case of the reading order in FIG. 10, the reading timings of pixels at the boundary between adjacent pixel blocks do not match each other. As a result of this, in the case of the reading order in FIG. 10, there is a possibility that discontinuity occurs in an image at the boundary between pixel blocks. On the other hand, according to the reading order in FIG. 11A, the reading timings of pixels located at the boundary between adjacent pixel blocks are close to each other. This can reduce discontinuity that occurs at the boundary between pixel blocks.

Figure 11B:
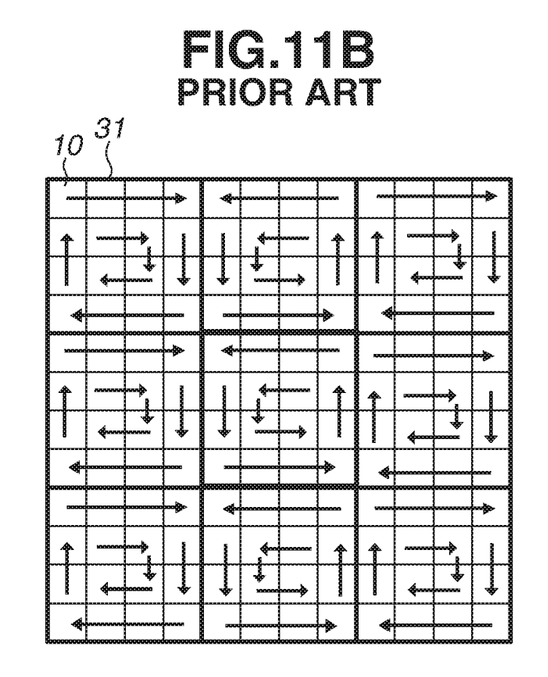

Further, Japanese Patent Application Laid-Open No. 2014-155175 also discusses a reading order in FIG. 11B (corresponding to FIG. 6 of Japanese Patent Application Laid-Open No. 2014-155175). In a pixel block 31 in FIG. 11B, with any of the four vertices (e.g., the first row and the first column, the first row and the fourth column, and the fourth row and the fourth column) of the pixel block 31 as a starting point, reading is performed in the row direction and then spirally shifts to the center of the pixel block 31. Also in the case of FIG. 11B, similar to the reading order in FIG. 11A, the reading timings of pixels located at the boundary between adjacent pixel blocks are close to each other. This can reduce discontinuity that occurs at the boundary between pixel blocks.

In the reading order in FIG. 10, in the pixel block 11 at the top left, immediately after the pixel in the second row and the fourth column is read, the pixel in the first row and the first column is read. Similarly, in the pixel block 21 at the top left in FIG. 11A, immediately after the pixel in the second row and the fourth column is read, the pixel in the first row and the first column is read. That is, in a case where reading shifts to an adjacent row, a pixel to be read next is away at a distance corresponding to the number of columns of the pixel block.

Incidentally, the remainder of reset may occur in a signal processing unit for processing a signal output from a pixel. That is, there is a possibility that the place which should be reset is not sufficiently reset. For example, there is a case where the reset potential of a clamp capacitor provided at the input of a comparator included in an AD conversion unit cannot reach a desired value. Due to this, a signal of a previously read pixel influences a signal of a pixel to be read next (crosstalk). In a case where the reading orders in FIGS. 10 and 11A are employed, and when intense light is incident on, for example, the pixel at the right end (the second row and the fourth column) of the pixel block, there is a possibility that an image is formed by irradiating the pixel at the left end (the first row and the first column), which is away from the right end column, with light having an amount of light greater than or equal to that of normal incident light. Even if crosstalk caused by the remainder of reset is very small, but if the right end column and the left end column are away from each other, the crosstalk is more conspicuous as an image than in a case where crosstalk occurs in adjacent pixels.

On the other hand, there is also an issue with the reading method in FIG. 11B. That is, in the reading order in FIG. 11B, there is a great difference between the time when the pixel at the left end of the first row of the pixel block 31 is read and the time when the pixel at the left end of the second row of the pixel block 31 is read. For example, in the example of FIG. 11B, the pixel in the second row and the first column is read 11 pixels after the pixel in the first row and the first column is read. As a result of this, the difference between the reading timings of adjacent pixels becomes great, which increases the possibility that discontinuity occurs in an image.

As described above, if the reading orders in FIGS. 1 and 5 of Japanese Patent Application Laid-Open No. 2014-155175 (corresponding to FIGS. 10 and 11A of the present application) are used, there is a possibility of forming an image in which crosstalk resulting from the remainder of the reset of a signal processing unit such as an AD conversion unit is conspicuous.

Further, if the reading order in FIG. 6 of Japanese Patent Application Laid-Open No. 2014-155175 (corresponding to FIG. 11B of the present application) is used, the difference between the reading timings of adjacent pixels becomes great, and there is a possibility that an image of an object becomes discontinuous.

That is, according to an imaging apparatus discussed in Japanese Patent Application Laid-Open No. 2014-155175, an image with good quality cannot be formed.

SUMMARY OF THE INVENTION

According to an aspect of the embodiments, an apparatus includes a pixel block including a plurality of pixels arranged in a matrix, a processing unit configured to process signals read from the plurality of pixels, and a reading unit configured to control a reading order of the plurality of pixels, wherein the reading unit reads in a first direction, a first pixel group including a part of the plurality of pixels, and after reading the first pixel group, reads in a second direction, which is opposite to the first direction, a second pixel group including a part of the plurality of pixels adjacent to the first pixel group.

Further features of the disclosure will become apparent from the following description of exemplary embodiments with reference to the attached drawings.

DESCRIPTION OF THE EMBODIMENTS

Figure 3A:
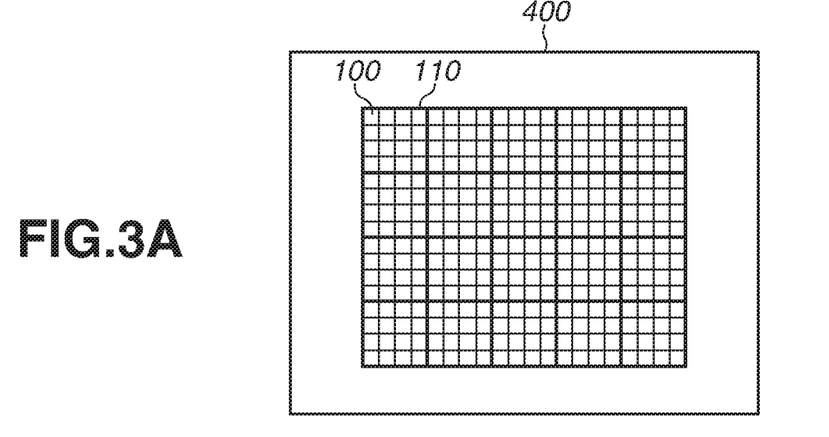
FIGS. 3A, 3B, and 3C are schematic diagrams illustrating the imaging apparatus according to the first exemplary embodiment.
Figure 3B:
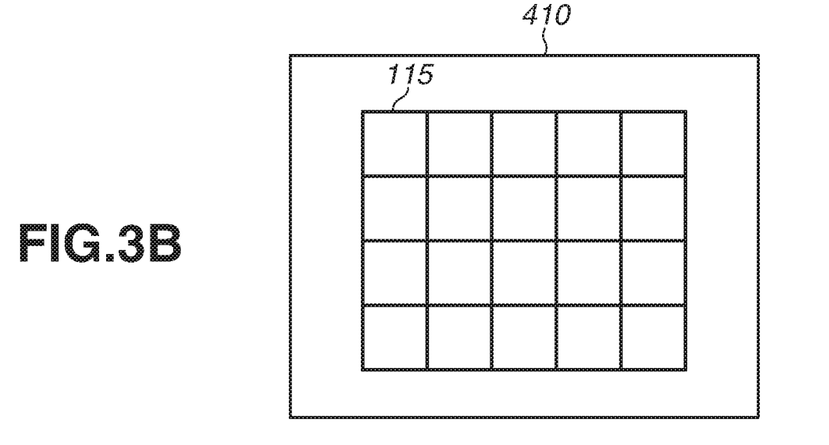
Figure 3C:
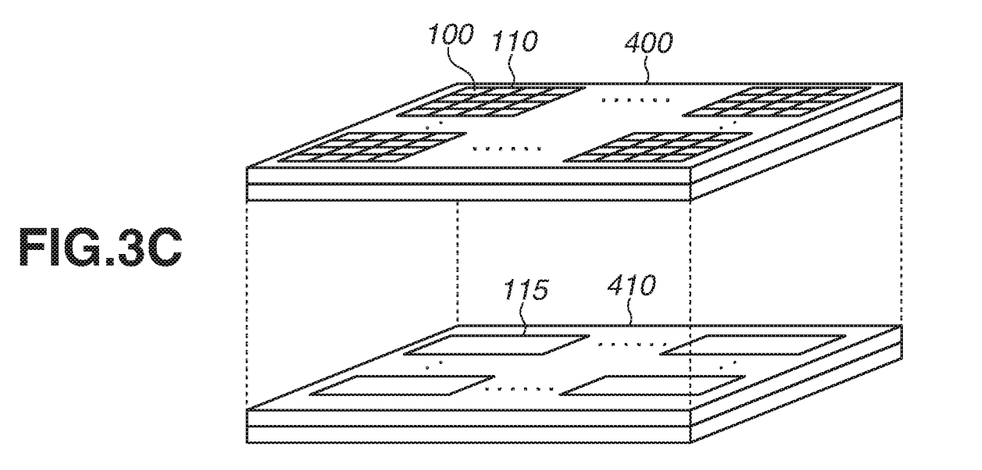

FIGS. 3A, 3B, and 3C are schematic diagrams illustrating an imaging apparatus according to a first exemplary embodiment. A first chip 400 includes a plurality of pixel blocks 110, each of which includes a plurality of pixels 100. Further, a second chip 410 includes a plurality of signal processing units 115. Each signal processing unit 115 includes an analog-digital conversion unit (an AD conversion unit) for converting an analog signal into a digital signal. The first chip 400 and the second chip 410 are laminated together, thereby forming a laminated-type imaging apparatus. In each pixel 100, a single photoelectric conversion unit is provided, and a single microlens (not illustrated) is provided corresponding to the single photoelectric conversion unit.

The pixel blocks 110 and the signal processing units 115 correspond to each other on a one-to-one basis. That is, the configuration is such that not all the pixels disposed on the first chip 400 are processed by a single signal processing unit, but the pixels are divided into a plurality of pixel blocks, and each pixel block is processed by a single signal processing unit. Consequently, it is possible to perform AD conversion in parallel. This can speed up processing. Further, as compared with a case where both a plurality of pixel blocks and a plurality of signal processing units are provided on a single substrate, it is not necessary to place wiring between each pixel block and a signal processing unit corresponding to the pixel block near another pixel block or another signal processing unit. Thus, it is possible to reduce crosstalk between pixel blocks.

A pair of a pixel block 110 and a signal processing unit 115 corresponding to each other is provided such that the pixel block 110 and the signal processing unit 115 overlap each other in a plan view. This placement shortens a channel electrically connecting an output line from the pixel block 110 and the signal processing unit 115. Thus, it is possible to reduce wiring capacity.

Figure 1A:
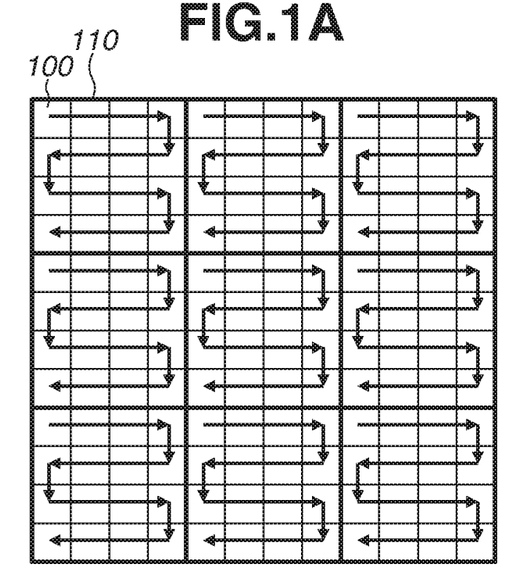
FIGS. 1A and 1B are schematic diagrams illustrating an imaging apparatus according to a first exemplary embodiment.

FIG. 1A illustrates the reading order of the pixel blocks 110. With the first row and the first column as a starting point, reading is started in the row direction. If the reading reaches the first row and the fourth column, reading is performed from the second row and the fourth column in the row direction and in a direction opposite to that of the reading of the first row. Such reading is sequentially performed to the fourth row and the first column. That is, the plurality of pixels disposed in the first row (a first pixel group) are read in a first direction. Further, the plurality of pixels disposed in the second row (a second pixel group) are read in a second direction, which is opposite to the first direction. Further, the plurality of pixels disposed in the third row (a third pixel group) are read in the first direction again.

Each signal processing unit 115 successively processes signals of pixels. The levels of the signals, however, differ from pixel to pixel according to the amount of light with which each pixel is irradiated. After the signal processing unit 115 performs signal processing on a certain pixel, and if the reset of the signal processing unit 115, which is performed while a signal of a next pixel is processed, is not complete, the signal level of the previous pixel influences the signal processing result of the next pixel (crosstalk). At this time, if the reading order of the pixels is set as illustrated in FIG. 1A, a pixel adjacent to a previous pixel is read, and therefore, crosstalk resulting from the remainder of the reset of the signal processing unit 115 continuously appears in the adjacent pixel. Consequently, even if crosstalk occurs, it is possible to make the crosstalk inconspicuous as an image.

Further, the reading method in FIG. 1A is capable of acquiring an image with higher quality than a reading method discussed in Japanese Patent Application Laid-Open No. 2014-155175. Referring to FIG. 11B, time for 11 pixels is required from the end of the reading of a pixel in the first row and the first column to the reading of a pixel in the second row and the first column. In contrast, in FIG. 1A, a maximum of time for seven pixels is required from the reading of a certain pixel to the reading of a pixel adjacent to the certain pixel. For example, time for seven pixels is only required from the end of the reading of the pixel in the first row and the first column to the end of the reading of the pixel in the second row and the first column. Thus, in one embodiment, the reading method in FIG. 1A requires about two thirds of the time of the reading method in FIG. 11B. Thus, when a high-speed object is imaged, it is possible to reduce the discontinuity of an image.

Further, the reading in FIG. 1A can be achieved using a simpler selection circuit than in the reading in FIG. 11B. For example, in FIG. 1A, reading in the row direction can be achieved by general shift registers and decoders, and reading in the column direction can be achieved by shift registers having a reverse running function and decoders having a function for switching between counting up and counting down.

Figure 1B:
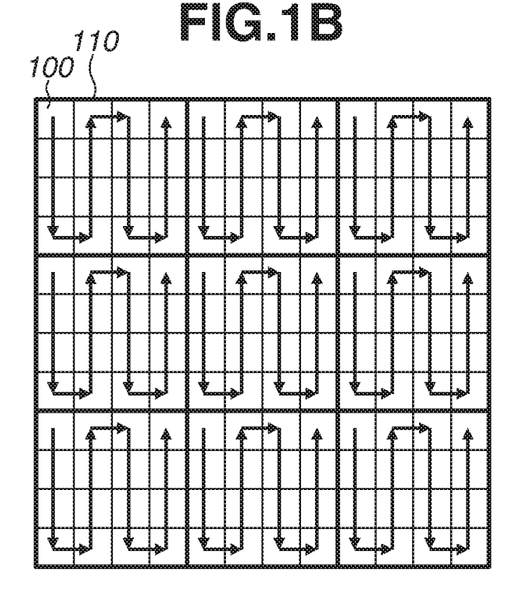

Although reading is performed in the direction of the ascending order of row numbers in FIG. 1A, reading may be performed in the direction of the descending order of row numbers. Alternatively, as illustrated in FIG. 1B, reading may be performed in the direction of the ascending order of column numbers. Further, although reading is performed in the direction of the ascending order of column numbers in FIG. 1B, reading may be performed in the direction of the descending order of column numbers.

After the last pixel in a pixel block is read, i.e., when a single frame ends, in one embodiment, the signal processing unit 115 is sufficiently reset and then the reading of a next frame is started. This is because, according to the reading orders in FIGS. 1A and 1B, a pixel to be read last in a first frame is not adjacent to a pixel to be read first in a second frame, and therefore, the influence of the remainder of reset is great. To sufficiently reset the signal processing unit 115, the period in which a reset signal is applied may be lengthened. Specifically, regarding the reset period of a clamp capacitor provided at the input of a comparator, a first period may be set for a pixel to be read last, and a second period may be set for a pixel other than the pixel to be read last. Then, the first period may be longer than the second period. Alternatively, the number of times the reset signal is input after a pixel to be read last is read may be greater than the number of times the reset signal is input after a pixel other than the pixel to be read last is read.

As described above, based on the imaging apparatus according to the present exemplary embodiment, it is possible to prevent crosstalk due to the remainder of the reset of a signal processing unit from being conspicuous as an image as compared with Japanese Patent Application Laid-Open No. 2014-155175. Further, it is possible to reduce the discontinuity of an object resulting from an increase in the difference between the reading timings of adjacent pixels. Consequently, it is possible to provide an imaging apparatus capable of forming an image with better quality than an imaging apparatus discussed in Japanese Patent Application Laid-Open No. 2014-155175.

(Relationship Between Operation of Imaging Apparatus and Crosstalk)

Figure 4:
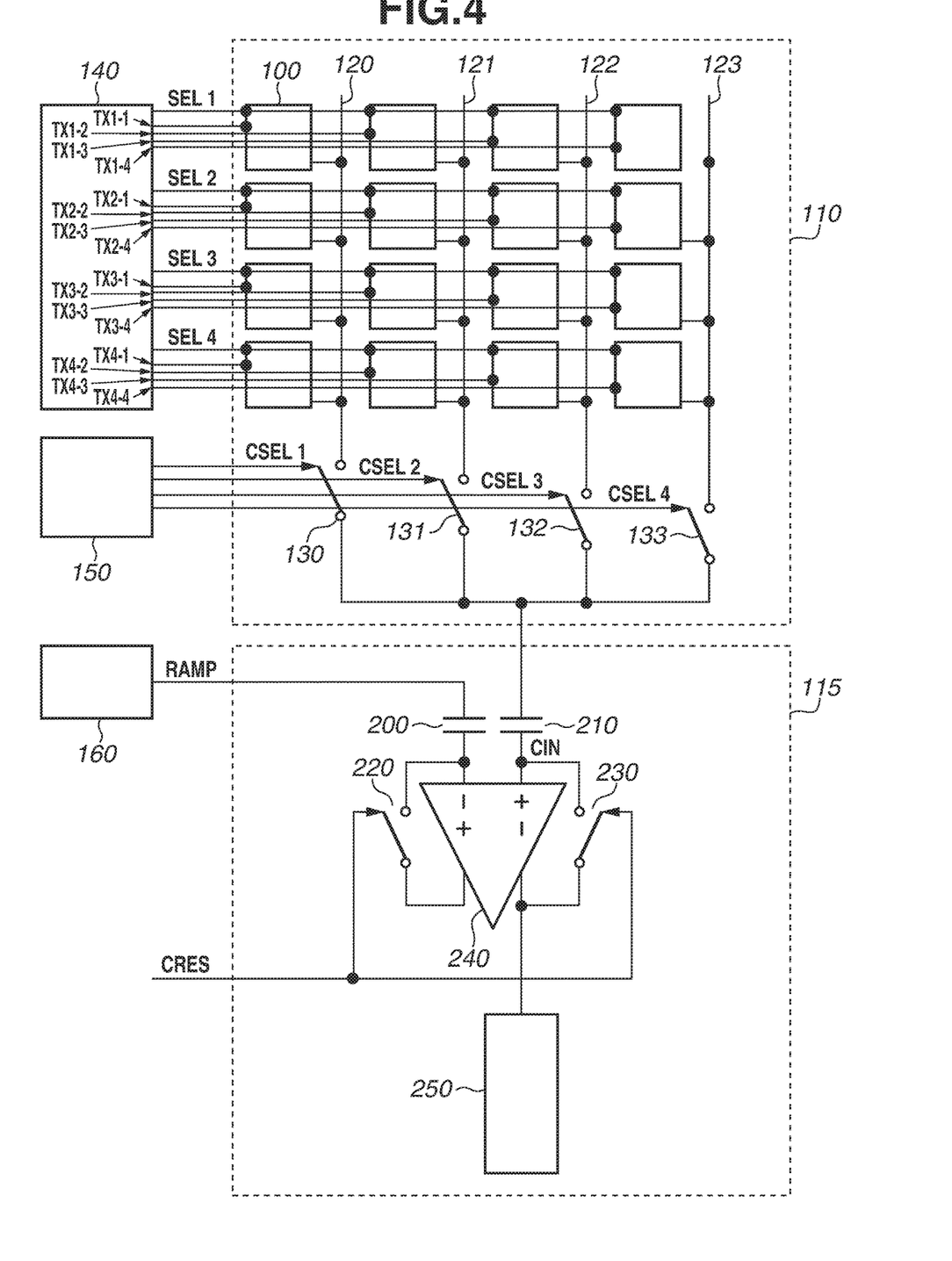
FIG. 4 is a schematic diagram illustrating the imaging apparatus according to the first exemplary embodiment.

Next, with reference to FIG. 4, the relationship between the operation of the imaging apparatus in FIGS. 1A and 1B and crosstalk is described in further detail. Each pixel block 110 includes signal lines 120 to 123 and switches 130 to 133 in addition to the pixels 100. The imaging apparatus includes a vertical reading unit (vertical scanning unit) 140, a horizontal reading unit (horizontal scanning unit) 150, and a ramp generator 160. Using control signals TX1-1 to TX4-4, the vertical reading unit 140 controls the accumulation times of the pixels in the rows disposed in the pixel block 110. Further, using control signals SEL1 to SEL4, the vertical reading unit 140 successively selects the rows of the pixel block 110. Further, the signal processing unit 115 includes capacitors 200 and 210, switches 220 and 230, a comparator 240, and a counter 250, thereby forming an AD conversion unit. To one input node of the comparator 240, the ramp generator 160 is connected via the capacitor 200, and a ramp signal (a comparison signal) is input. Further, to the other input node of the comparator 240, the signal lines 120 to 123 are connected via the capacitor 210. The capacitor 210 clamps a pixel reset level and therefore is also referred to as a "clamp capacitor". To one node of the capacitor 210, analog signals are input through the signal lines 120 to 123. Further, to the other node of the capacitor 210, a signal at a reset level is input by CRES reaching a high level. Using control signals CSEL1 to CSEL4, the horizontal reading unit 150 selects the signal lines 120 to 123 to connect to the signal processing unit 115, thereby successively selecting the columns of the pixel block 110.

Figure 5:
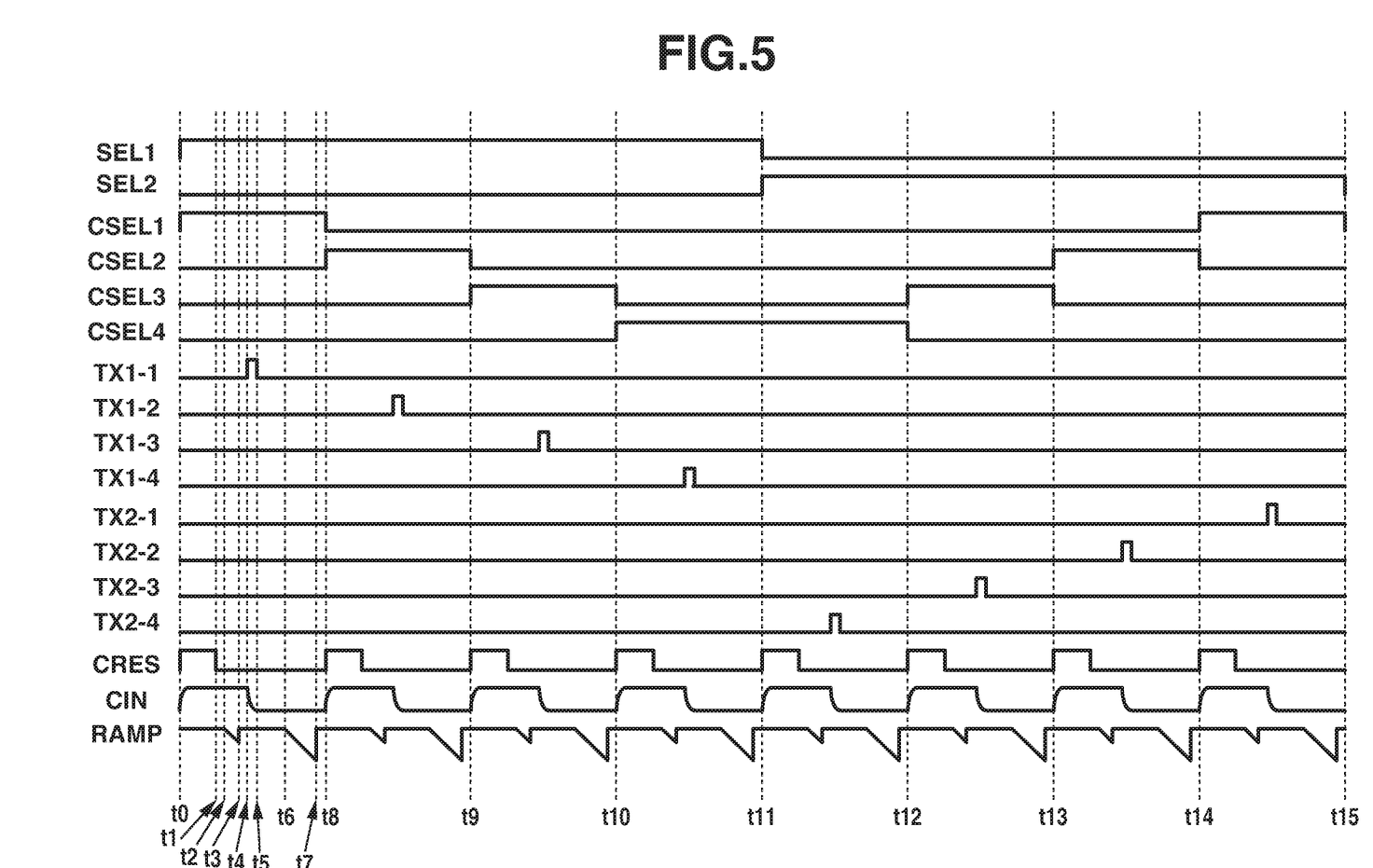
FIG. 5 is a timing diagram of the imaging apparatus according to the first exemplary embodiment.

Next, with reference to FIG. 5, the operation will be described using an example of the operation waveforms of the imaging apparatus in FIG. 4. From a time t0 to a time t11, the control signal SEL1 is at a high level, the control signals SEL2, SEL3, and SEL4 are at low levels (the control signals SEL3 and SEL4 are not illustrated), and the top row of the pixel block 110 is in a selected state. From the time t0 to a time t8, the control signal CSEL1 is at a high level. From the time t8 to a time t9, the control signal CSEL2 is at a high level. From the time t9 to a time t10, the control signal CSEL3 is at a high level. From the time t10 to the time t11, the control signal CSEL4 is at a high level. Consequently, the first to fourth columns of the pixel block 110 are successively selected.

From the time t11 to a time t15, the control signal SEL2 is at a high level, the control signals SEL1, SEL3, and SEL4 are at low levels (the control signals SEL3 and SEL4 are not illustrated), and the second row from the top of the pixel block 110 is in a selected state. From the time t11 to a time t12, the control signal CSEL4 is at a high level. From the time t12 to a time t13, the control signal CSEL3 is at a high level. From the time t13 to a time t14, the control signal CSEL2 is at a high level. From the time t14 to the time t15, the control signal CSEL1 is at a high level. Consequently, the fourth to first columns of the pixel block 110 are successively selected this time.

Next, the reading of a signal of a single pixel and the processing operation of the signal processing unit 115 will be described. At the time t0, the pixel 100 in the first row and the first column of the pixel block 110 is selected and connected to the signal processing unit 115. CRES reaches a high level, whereby the switch 230 enters an on state, and one input node CIN of the comparator 240 is reset to a reset level. Simultaneously, the switch 220 also enters an on state, and the other input node of the comparator 240 is also reset to a reset level.

By the time t1, the reset is completed, and the pixel reset level of an output from the pixel 100 is also clamped. That is, at the time t1, the input node CIN, which is one node of the capacitor 210, is at the reset level of the comparator 240, and the other node of the capacitor 210 is at the reset level of the pixel 100 in the first row and the first column of the pixel block 110. At this time, the node on the comparator 240 side of the capacitor 200 is at the reset level of the comparator 240, and the node on the other side of the capacitor 200 is at the reference level of RAMP.

At the time t1, CRES is turned off, and the reset of the comparator 240 and the clamping of the pixel reset level are ended. From a time t2 to a time t3, RAMP is sloped down, the counter 250 measures the time taken until the output of the comparator 240 is inverted, and a digital value corresponding to the measured time (t3–t2) is obtained as the AD conversion value of the pixel reset level. At a time t4, the control signal TX1-1 reaches a high level, thereby turning on a transfer transistor provided in the pixel 100. Consequently, the photoelectric conversion unit transfers a signal charge to a floating diffusion, and the pixel 100 outputs a signal level. The reset level transitions to the signal level, whereby the potential of the input node CIN also decreases according to the signal level. The signal level differs from pixel to pixel according to the amount of light with which each pixel is irradiated.

From a time t6 to a time t7, RAMP is sloped down again, the counter 250 measures the time taken until the output of the comparator 240 is inverted, and a digital value corresponding to the measured time (t7–t6) is obtained as the AD conversion value of the pixel signal level. The difference between the AD conversion value of the pixel signal level and the AD conversion value of the pixel reset level is taken, thereby obtaining a final AD conversion result.

At the time t8, to read a next pixel, the reset of the comparator 240 and the clamping of the pixel reset level are started again. At this time, if the operation of resetting the comparator 240 performed with CRES at a high level is not complete, the lower the potential of the input node CIN from a time t5 to the time t8, the lower the reset level of the input node CIN when the next pixel is read. Consequently, there is a possibility that the operating point of the comparator 240 fluctuates due to the signal level of the previous pixel, and crosstalk from the previous reading pixel to the next reading pixel occurs. In the present exemplary embodiment, adjacent pixels are continuously read, and therefore, crosstalk is prevented from being conspicuous as an image as compared with Japanese Patent Application Laid-Open No. 2014-155175.

Figure 6:
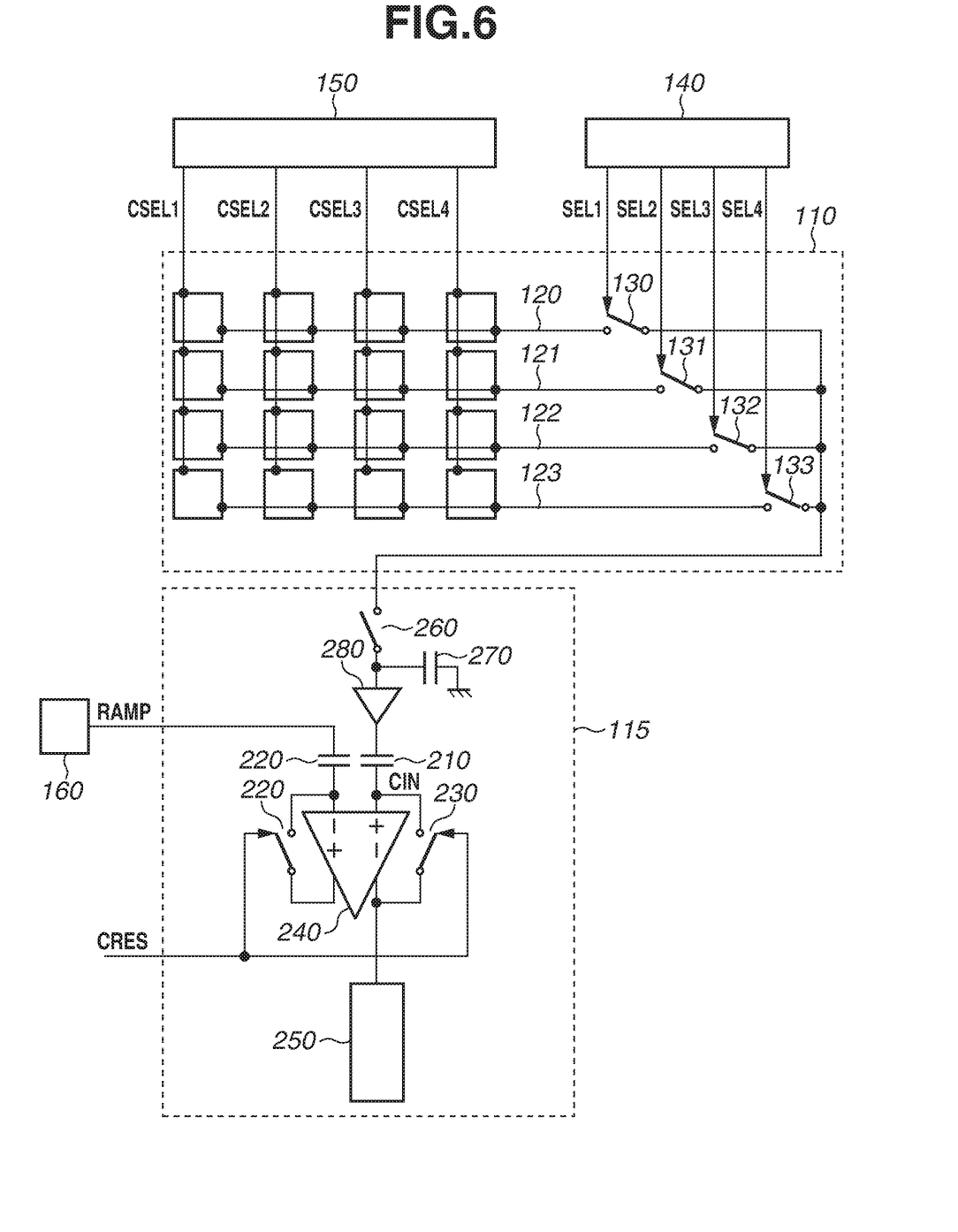
FIG. 6 is a schematic diagram illustrating the imaging apparatus according to the first exemplary embodiment.

FIG. 6 is a variation of the imaging apparatus in FIG. 4. Driving lines for the control signals TX1-1 to TX4-4 illustrated in FIG. 4 are omitted. FIGS. 4 and 6 are different from each other in the following respect. In FIG. 4, after rows are selected, columns are selected. In contrast, in FIG. 6, after columns are selected, rows are selected. Specifically, in FIG. 6, signal lines 120 to 123 are shared by the pixels 100 in the row direction. In this case, columns are selected using pixel control lines CSEL1 to CSEL4, and rows are selected using switches 130 to 133. Further, in FIG. 6, a sample holding unit including a switch 260 and a capacitor 270, and a buffer 280 are included. The capacitor 270 is occasionally referred to as a "sample holding capacitor". In a case where such a sample holding unit is included, the capacitor 270 holds the signal level of a certain pixel, and while AD conversion is performed on the signal level in the state, the pixel block 110 can start reading the reset level of a next pixel. This enables a high-speed operation. That is, parts of the reading of the previous pixel and the reading of the next pixel are overlapped, thereby enabling high-speed processing. In this case, however, the overlapping of operations increases the risk of crosstalk from the previous pixel to the next pixel. For example, the timing when the output of the comparator 240 is inverted changes according to the signal level of the previous pixel. This changes interference with the reset level of the next pixel. Further, the capacitor 270, which is used for sample holding, also causes crosstalk. The initial value of the reset level of a pixel 100 to be written to the capacitor 270 is the signal level of a previous pixel. Thus, if the writing is not complete, crosstalk occurs. As described above, it is possible to speed up processing, but the risk of crosstalk increases at the same time. In such a configuration, particularly, it is important to prevent crosstalk from appearing in pixels placed far from each other and becoming conspicuous as an image. The method for reading pixel signals described in the present exemplary embodiment works more effectively.

(Other Variations)

Figure 2A:
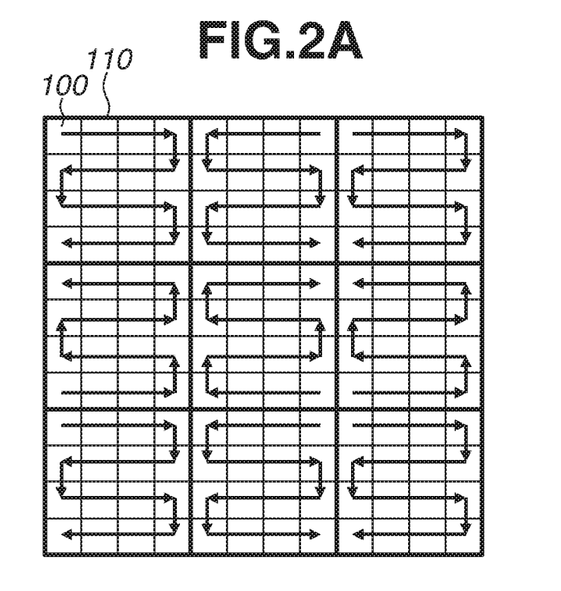
FIGS. 2A and 2B are schematic diagrams illustrating the imaging apparatus according to the first exemplary embodiment.
Figure 2B:
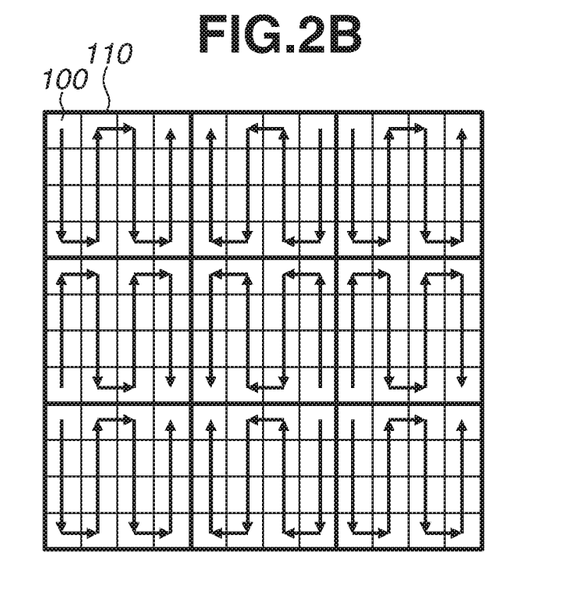

FIGS. 2A and 2B illustrate variations of the reading method in FIGS. 1A and 1B. In FIGS. 2A and 2B, the configuration is such that the reading orders of pixels 100 are line-symmetric between adjacent pixel blocks 110. In other words, a pixel group disposed in the first row of a first pixel block (a first pixel group) and a pixel group disposed in the first row of a second pixel block (a first pixel group) are placed opposed to each other. Further, the direction in which the first pixel group of the first pixel block is read (a first direction) and the direction in which the first pixel group of the second pixel block is read (a first direction) are opposite to each other. Consequently, it is possible to match the reading timings of pixels between adjacent pixel blocks 110 and reduce the discontinuity of an image spanning the pixel blocks 110.

Further, as illustrated in FIGS. 4 and 6, the present exemplary embodiment has been described taking a slope-type AD converter as an example. The AD converter, however, is not limited to the slope type. For example, the ramp generator 160 and the capacitor 200 may be replaced with a binary weight capacitor group, thereby forming a successive approximation-type AD converter.

Further, as illustrated in FIGS. 1A, 1B, 2A, and 2B, the present exemplary embodiment has been described on the premise that the plurality of pixel blocks 110 are included. Alternatively, a pixel array in which a plurality of pixels are arranged in a matrix may be considered as a single pixel block, and the above reading method may be employed for the pixel array.

Additionally, as illustrated in FIGS. 3A, 3B, and 3C, in the present exemplary embodiment, a laminated-type imaging apparatus has been described which includes the pixel blocks 110 on the first chip 400 and the signal processing units 115 on the second chip 410. The disclosure according to the present exemplary embodiment, however, can also be applied to an imaging apparatus that is not of a laminated-type.

Figure 7A:
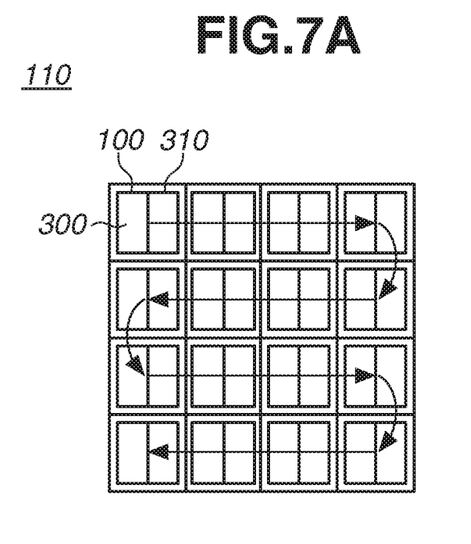
FIGS. 7A and 7B are schematic diagrams illustrating an imaging apparatus according to a second exemplary embodiment.
Figure 7B:
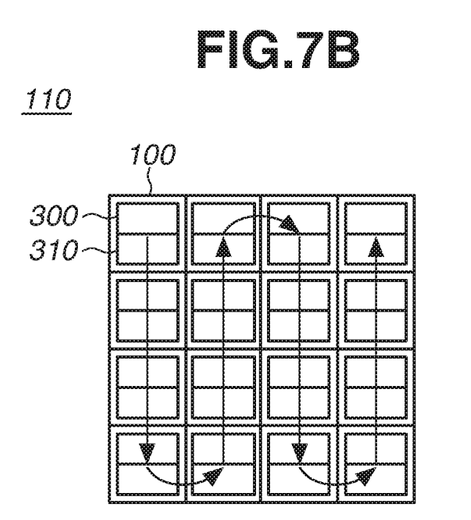

FIGS. 7A and 7B are schematic diagrams illustrating pixel blocks 110 according to a second exemplary embodiment. As illustrated in FIGS. 7A and 7B, pixels 100 each include a first photoelectric conversion unit 300 and a second photoelectric conversion unit 310 for phase detection, corresponding to a single microlens. In FIG. 7A, the first photoelectric conversion unit 300 and the second photoelectric conversion unit 310 are divided in the row direction (the horizontal direction). An image in the row direction obtained from the first photoelectric conversion unit 300 and an image in the row direction obtained from the second photoelectric conversion unit 310 are compared with each other, thereby detecting the phase difference between the images. At this time, if the reading times of pixels 100 placed in the row direction are greatly different from each other, there is a possibility that images used for phase detection becomes discontinuous. In response, in a case where each pixel 100 includes the photoelectric conversion units 300 and 310 divided in the row direction as in FIG. 7A, a method for reading the pixels in the row direction and sequentially shifting the reading in the column direction is used. In this case, for example, using the imaging apparatus in FIG. 4, rows are selected, and reading is performed successively in the order of columns.

On the other hand, in a case where each pixel 100 includes the photoelectric conversion units 300 and 310 divided in the column direction (the vertical direction) as in FIG. 7B, a form for scanning the pixels in the column direction and sequentially shifting the scanning in the row direction is used. In this case, for example, using the imaging apparatus in FIG. 6, columns are selected, and reading is performed successively in the order of rows.

Further, signals of the first photoelectric conversion unit 300 and the second photoelectric conversion unit 310 may not be used for phase detection. Instead, it is also possible to normally acquire an image, together with phase detection, by adding up the signals of the first photoelectric conversion unit 300 and the second photoelectric conversion unit 310.

Further, in the present exemplary embodiment, the signals of the first photoelectric conversion unit 300 and the second photoelectric conversion unit 310 are successively read. If, however, the signal processing unit 115 includes a signal processing unit for the first photoelectric conversion unit 300 and a signal processing unit for the second photoelectric conversion unit 310, it is possible to simultaneously read both signals in parallel. Consequently, it is possible to ensure the simultaneity of phase detection images and perform processing by further reducing the influence of the discontinuity of both images.

Further, the present exemplary embodiment has been described using an example where all the pixels 100 have a two-pixel configuration for phase detection. The two-pixel configuration, however, is not limited to all the pixels. Alternatively, the configuration may be employed in which pixels for phase detection are discretely placed.

Based on the imaging apparatus according to the present exemplary embodiment, it is possible to prevent crosstalk resulting from the remainder of the reset of a signal processing unit from being conspicuous as an image as compared with Japanese Patent Application Laid-Open No. 2014-155175. Further, it is possible to reduce the discontinuity of an object resulting from an increase in the difference between the reading timings of adjacent pixels. Consequently, it is possible to provide an imaging apparatus capable of forming an image with better quality than the imaging apparatus discussed in Japanese Patent Application Laid-Open No. 2014-155175.

Figure 8:
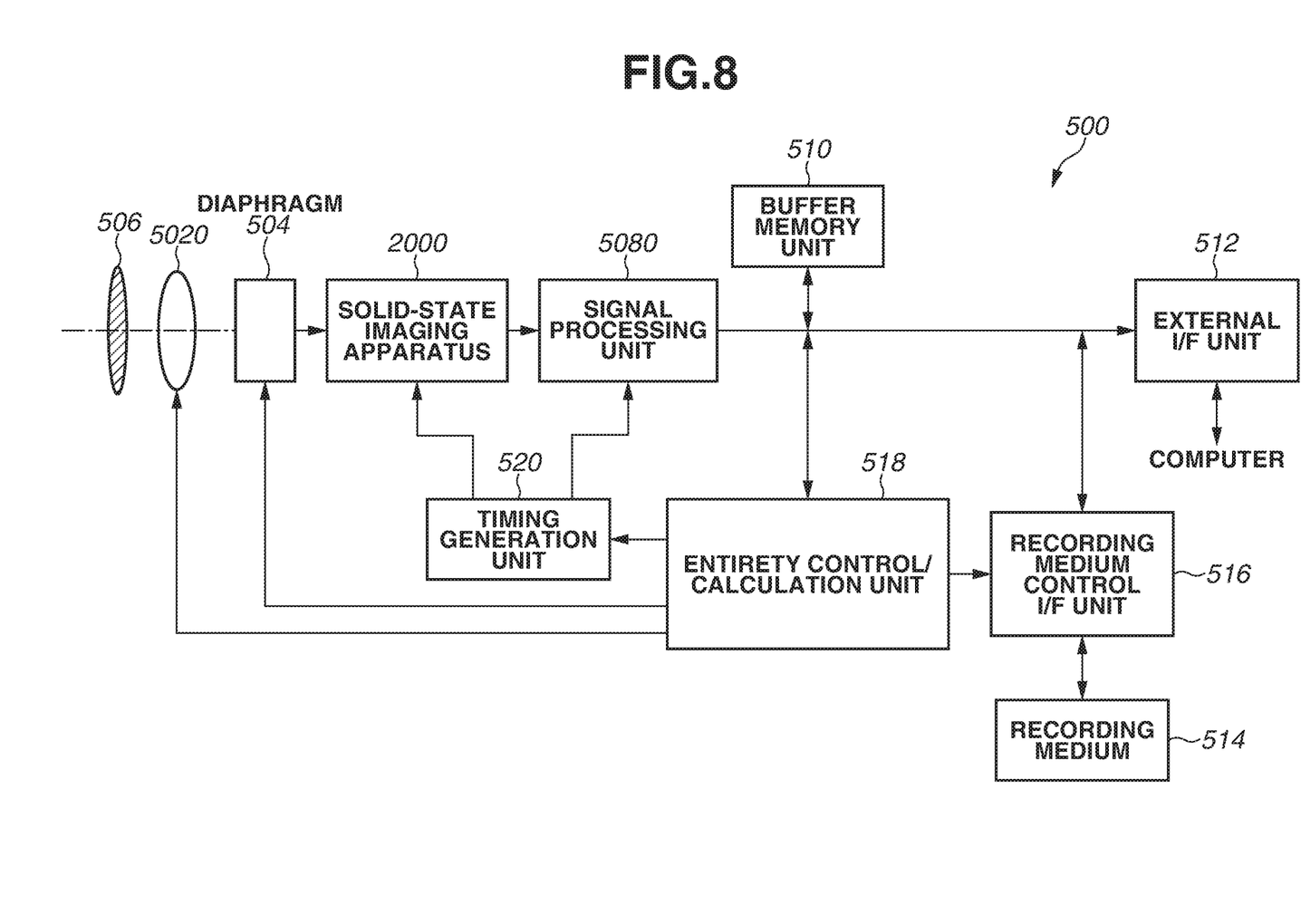
FIG. 8 is a diagram illustrating a configuration of an imaging system according to a third exemplary embodiment.

FIG. 8 is a block diagram illustrating the configuration of an imaging system 500 according to a third exemplary embodiment. The imaging system 500 according to the present exemplary embodiment includes an imaging apparatus 2000, to which the configuration of either of the above imaging apparatuses is applied. Specific examples of the imaging system 500 include a digital still camera, a digital camcorder, and a monitoring camera. The imaging system 500 includes the imaging apparatus 2000, a lens 5020, a diaphragm 504, and a barrier 506, which protects the lens 5020. The imaging system 500 includes a signal processing unit 5080, which processes an output signal output from the imaging apparatus 2000. The signal processing unit 5080 performs a signal processing operation for performing various types of correction and compression on an input signal as necessary and outputting the resulting signal. The signal processing unit 5080 may have the function of performing an AD conversion process on a signal output from the imaging apparatus 2000. The imaging system 500 further includes a buffer memory unit 510, which temporarily stores image data, and an external interface unit (external I/F unit) 512, which is used to communicate with an external computer. Further, the imaging system 500 includes a recording medium 514 such as a semiconductor memory to or from which captured data is recorded or read, and a recording medium control interface unit (recording medium control I/F unit) 516, which is used to record or read captured data to or from the recording medium 514.

Further, the imaging system 500 includes an entirety control/calculation unit 518, which performs various calculations and also controls the entirety of the digital still camera, and a timing generation unit 520, which outputs various timing signals to the imaging apparatus 2000 and the signal processing unit 5080. The imaging apparatus 2000 outputs an image signal to the signal processing unit 5080. The signal processing unit 5080 performs predetermined signal processing on the image signal output from the imaging apparatus 2000 and outputs image data. Further, the signal processing unit 5080 generates an image using the image signal.

An imaging system is configured using the imaging apparatus according to each of the above exemplary embodiments, whereby it is possible to achieve an imaging system capable of acquiring an image with better quality.

Figure 9A:
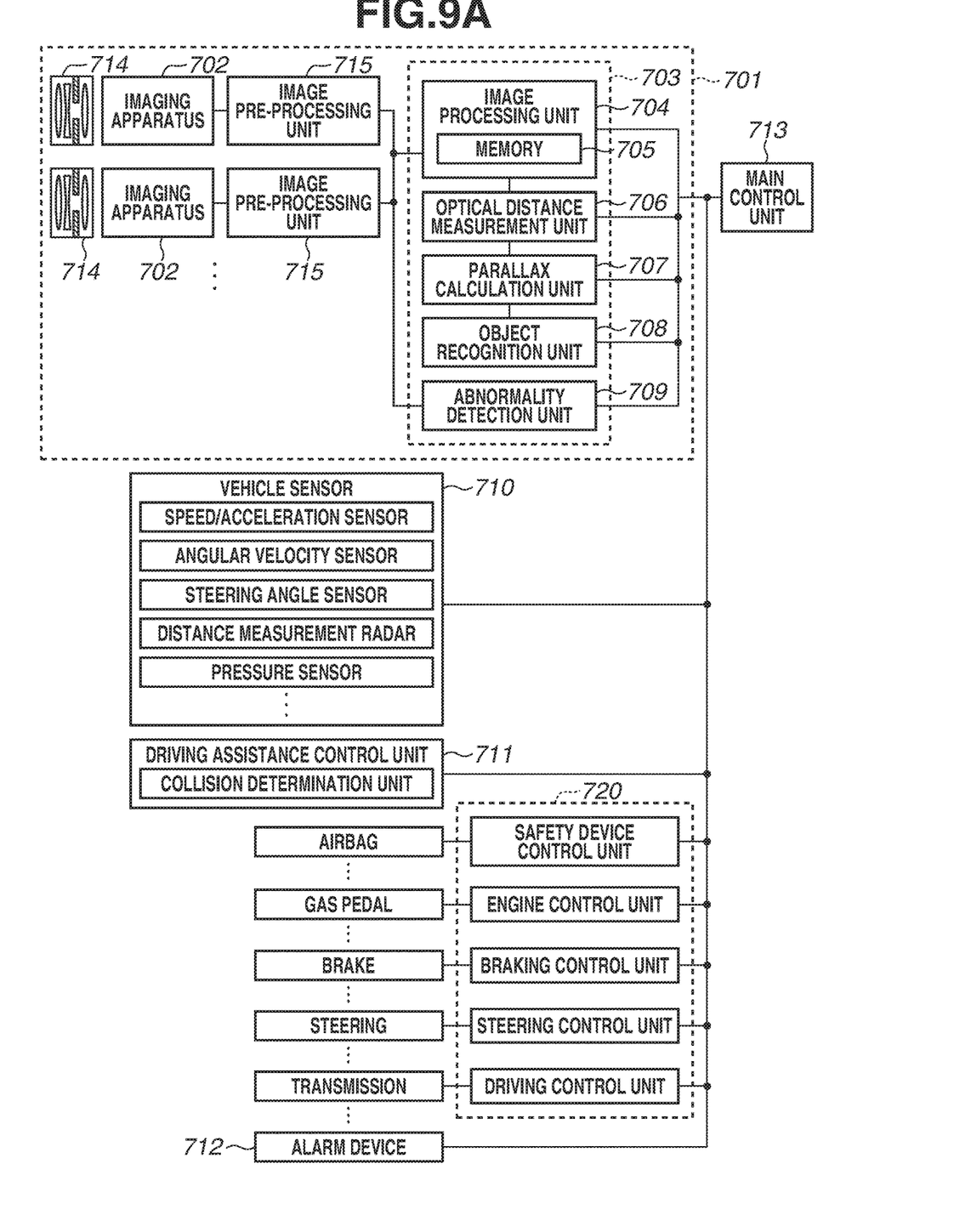
FIGS. 9A and 9B are diagrams illustrating a configuration of a moving body according to a fourth exemplary embodiment.
Figure 9B:
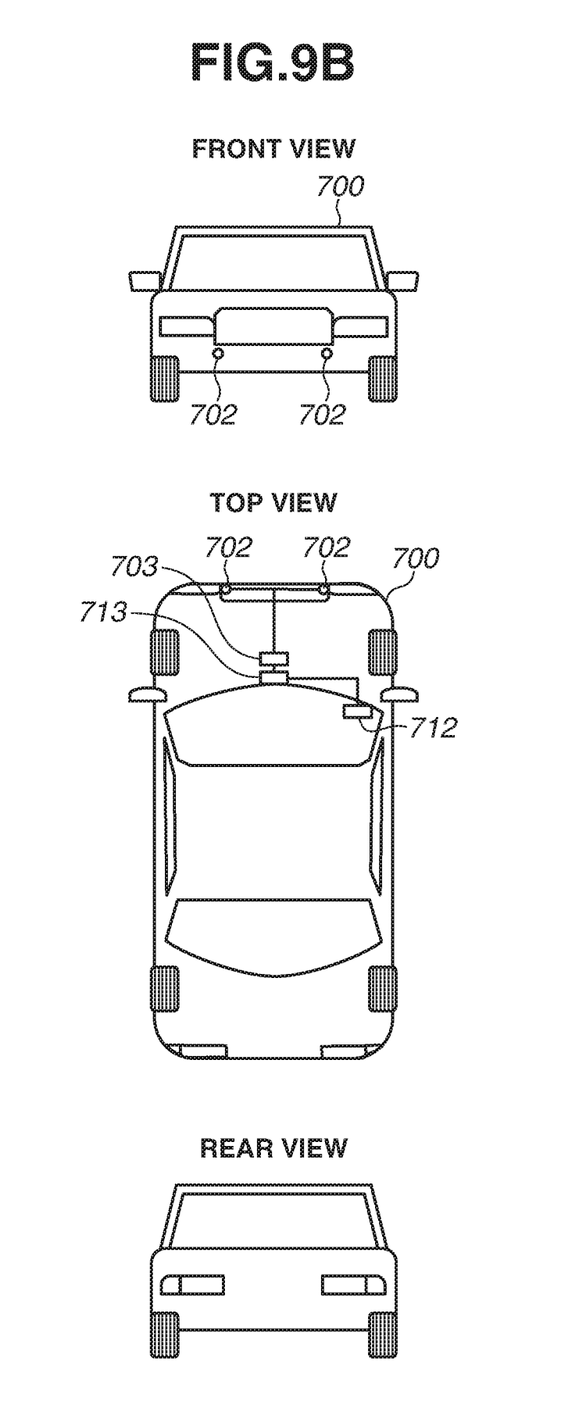

With reference to FIGS. 9A and 9B, an imaging system and a moving body according to a fourth exemplary embodiment are described. In the present exemplary embodiment, an example of an imaging system regarding an in-vehicle camera is illustrated. FIGS. 9A and 9B illustrate examples of a vehicle system and an imaging system mounted on the vehicle system. An imaging system 701 includes an imaging apparatus 702, an image pre-processing unit 715, an integrated circuit 703, and an optical system 714. The optical system 714 forms an optical image of an object on the imaging apparatus 702. The imaging apparatus 702 converts the optical image of the object formed by the optical system 714 into an electric signal. The imaging apparatus 702 is the imaging apparatus according to any of the above exemplary embodiments. The image pre-processing unit 715 performs predetermined signal processing on the signal output from the imaging apparatus 702. In the imaging system 701, at least two sets of the optical system 714, the imaging apparatus 702, and the image pre-processing unit 715 are provided so that outputs from the image pre-processing units 715 in the respective sets are input to the integrated circuit 703.

The integrated circuit 703 is an integrated circuit for an imaging system and includes an image processing unit 704, which includes a memory 705, an optical distance measurement unit 706, a parallax calculation unit 707, an object recognition unit 708, and an abnormality detection unit 709. The image processing unit 704 performs a development process or image processing such as defect correction on an output signal from each image pre-processing unit 715. The memory 705 primarily stores a captured image or stores the position of a defect of a captured pixel. The optical distance measurement unit 706 focuses on an object or measures the distance from the object. The parallax calculation unit 707 calculates a parallax (the phase difference between parallax images) from a plurality of pieces of image data acquired by the plurality of imaging apparatuses 702. The object recognition unit 708 recognizes an object such as a car, a road, a sign, or a person. If detecting an abnormality of the imaging apparatuses 702, the abnormality detection unit 709 informs a main control unit 713 of the abnormality.

The integrated circuit 703 may be achieved by hardware designed exclusively for the integrated circuit 703, or achieved by a software module, or achieved by the combination of these. Alternatively, the integrated circuit 703 may be achieved by a field-programmable gate array (FPGA) or an application-specific integrated circuit (ASIC), or achieved by the combination of these.

The main control unit 713 performs overall control of the operations of the imaging system 701, a vehicle sensor 710, and a control unit 720. It is also possible to employ a method in which the main control unit 713 is not included, and the imaging system 701, the vehicle sensor 710, and the control unit 720 individually include communication interfaces, and each transmit and receive a control signal via a communication network (e.g., the Controller Area Network (CAN) standard).

The integrated circuit 703 has the function of transmitting a control signal or a setting value to each imaging apparatus 702 by receiving a control signal from the main control unit 713 or by a control unit of the integrated circuit 703. For example, the integrated circuit 703 transmits a setting for driving a voltage switch 13 in the imaging apparatus 702 in a pulsed manner, or a setting for switching the voltage switch 13 in each frame.

The imaging system 701 is connected to the vehicle sensor 710 and can detect the running states, such as the speed, the yaw rate, and the steering angle, of a vehicle in which the imaging system 701 is provided, the environment outside the vehicle, and the states of another vehicle and an obstacle. The vehicle sensor 710 is also a distance information acquisition unit for acquiring, from parallax images, information regarding the distance from a target object. Further, the imaging system 701 is connected to a driving assistance control unit 711, which performs various types of driving assistance such as automatic steering, automatic cruising, and a collision prevention function. Particularly, regarding a collision determination function, based on the detection result of the imaging system 701 or the vehicle sensor 710, a collision determination unit estimates collision with another vehicle or an obstacle or determines the presence or absence of collision with another vehicle or an obstacle. Consequently, in a case where collision is estimated, avoidance control is performed. Further, when collision occurs, a safety device is started.

Further, the imaging system 701 is also connected to an alarm device 712, which gives an alarm to a driver based on the determination result of the collision determination unit. For example, as the determination result of the collision determination unit, if there is a high possibility of collision, the main control unit 713 applies a brake, returns the gas pedal, or suppresses the engine output, thereby controlling the vehicle to avoid collision and reduce damage. The alarm device 712 warns a user by setting off an alarm such as a sound, displaying alarm information on a screen of a display unit of an automotive navigation system or a meter panel, or imparting a vibration to a seat belt or the steering.

In the present exemplary embodiment, the imaging system 701 images the periphery, such as the front or the rear, of the vehicle. FIG. 9B illustrates an example of the placement of the imaging system 701 in a case where the imaging system 701 captures the front direction of the vehicle.

Further, in the present exemplary embodiment, control for preventing a vehicle from colliding with another vehicle has been described. Alternatively, the present exemplary embodiment is also applicable to control for automatically driving a vehicle by following another vehicle, or control for automatically driving a vehicle so as to stay in a lane. Further, the imaging system 701 can be applied not only to a vehicle such as an automobile but also to a moving body (a moving apparatus) such as a vessel, an aircraft, or an industrial robot. Additionally, the imaging system 701 can be applied not only to a moving body but also to a device widely using object recognition, such as an intelligent transportation system (ITS).

Other Exemplary Embodiments

While the exemplary embodiments have been described, the disclosure is not limited to these exemplary embodiments, and can be changed and modified in various manners. Further, the exemplary embodiments are applicable to each other.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-192056, filed Sep. 29, 2017, which is hereby incorporated by reference herein in its entirety.

What is claimed is:

1. An apparatus comprising:
a plurality of pixel blocks, each of the plurality of pixel blocks including a plurality of pixels arranged in a matrix;
a processing unit configured to process signals read from the plurality of pixels; and
a reading unit configured to control a reading order of the plurality of pixels,
wherein the pixel block includes a first pixel group including two or more pixels of the plurality of pixels, a second pixel group including two or more pixels of the plurality of pixels, and a third pixel group including two or more pixels of the plurality of pixels,
wherein the second pixel group is arranged between the first pixel group and the third pixel group,
wherein the reading unit
reads two or more pixels of the first pixel group belonging to a first pixel block continuously in a first direction,
immediately after reading a last pixel in the first direction in the first pixel group belonging to a first pixel block, next, reads a first pixel in a second direction opposite to the first direction in the second pixel group belonging to a first pixel block, wherein the first pixel in the second pixel group is arranged adjacent to the last pixel in the first pixel group,
immediately after reading the first pixel in the second pixel group belonging to a first pixel block, next, reads two or more pixels of the second pixel group continuously in the second direction,
immediately after reading a last pixel in the second direction in the second pixel group belonging to a first pixel block, next, reads a first pixel in the first direction in the third pixel group belonging to a first pixel block, wherein the first pixel in the third pixel group is arranged adjacent to the last pixel in the second pixel group,
immediately after reading the first pixel in the third pixel group belonging to a first pixel block, next, reads two or more pixels of the third pixel group continuously in the first direction,
wherein the reading unit
reads two or more pixels of the first pixel group belonging to a second pixel block, continuously in the first direction, the second pixel block being arranged adjacent to the first pixel block in the first direction, immediately after reading a last pixel in the first direction in the first pixel group belonging to the second pixel block, next, reads a first pixel in the second direction in the second pixel group belonging to the second pixel block, wherein the first pixel in the second pixel group is arranged adjacent to the last pixel in the first pixel group, immediately after reading the first pixel in the second pixel group belonging to the second pixel block, next, reads two or more pixels of the second pixel group continuously in the second direction, immediately after reading a last pixel in the second direction in the second pixel group belonging to the second pixel block, next, reads a first pixel in the first direction in the third pixel group belonging to the second pixel block, wherein the first pixel in the third pixel group is arranged adjacent to the last pixel in the second pixel group, immediately after reading the first pixel in the third pixel group belonging to the second pixel block, next, reads two or more pixels of the third pixel group continuously in the first direction, wherein the first pixel group belonging to the first pixel block and the first pixel group belonging to the second pixel block are arranged so as to face each other, wherein the second pixel group belonging to the first pixel block and the second pixel group belonging to the second pixel block are arranged so as to face each other, and wherein the third pixel group belonging to the first pixel block and the third pixel group belonging to the second pixel block are arranged so as to face each other.

2. The apparatus according to claim 1, further comprising:
a first chip including the plurality of pixel blocks; and
a second chip including a plurality of processing units,
wherein the first and second chips are laminated together.

3. The apparatus according to claim 2, wherein the plurality of pixel blocks includes a first pixel block, and a second pixel block disposed adjacent to the first pixel block,
wherein a first pixel group of the first pixel block and a first pixel group of the second pixel block are disposed opposed to each other, and
wherein a first direction of the first pixel block and a first direction of the second pixel block are opposite to each other.

4. The apparatus according to claim 3, comprising:
a first processing unit; and
a second processing unit disposed adjacent to the first processing unit,
wherein the first processing unit is disposed corresponding to the first pixel block, and
wherein the second processing unit is disposed corresponding to the second pixel block.

5. The apparatus according to claim 1, wherein the first and second directions are a row direction or a column direction.

6. The apparatus according to claim 1,
wherein each of the plurality of pixels includes first and second photoelectric conversion units provided corresponding to a single microlens, and
wherein a direction in which the first and second photoelectric conversion units are adjacent to each other is the same as the first direction.

7. The apparatus according to claim 1,
wherein the processing unit includes an analog-digital (AD) conversion unit configured to convert an analog signal output from the pixel block into a digital signal,
wherein the AD conversion unit includes a comparator configured to compare the analog signal with a comparison signal,
wherein a clamp capacitor is connected to an input node of the comparator,
wherein the analog signal is input to one node of the clamp capacitor, and
wherein a reset signal is input to the other node of the clamp capacitor.

8. The apparatus according to claim 7, wherein the processing unit includes a sample holding capacitor between the clamp capacitor and the pixel block.

9. The apparatus according to claim 7, wherein regarding a period in which the reset signal is input to the clamp capacitor, a first period in which the reset signal regarding a pixel to be read last among the plurality of pixels is input is longer than a second period in which the reset signal regarding a pixel other than the pixel to be read last among the plurality of pixels is input.

10. The apparatus according to claim 7, wherein regarding a number of times the reset signal is input to the clamp capacitor, the number of times the reset signal is input after a pixel to be read last among the plurality of pixels is read is greater than the number of times the reset signal is input after a pixel other than the pixel to be read last among the plurality of pixels is read.

11. A system comprising:
the apparatus according to claim 1; and
a processing unit configured to process a signal output from the apparatus, thereby generating an image.

12. The system according to claim 11, wherein the first and second directions are a row direction or a column direction.

13. A moving body comprising:
the apparatus according to claim 1;
a distance information acquisition unit configured to acquire, from a parallax image based on a signal from the apparatus, information regarding a distance from a target object; and
a control unit configured to control the moving body based on the distance information.

14. The moving body according to claim 13,
wherein the apparatus further comprises a third pixel group including a part of the plurality of pixels adjacent to the second pixel group, and
wherein, after the second pixel group is read, the third pixel group is read in the first direction.

15. The moving body according to claim 13, wherein the apparatus further comprises:
a first chip including a plurality of pixel blocks; and
a second chip including a plurality of processing units,
wherein the first and second chips are laminated together.

16. The moving body according to claim 13, wherein the first and second directions are a row direction or a column direction.

* * * * *